(12) United States Patent
Liu et al.

(10) Patent No.: US 8,798,563 B2
(45) Date of Patent: Aug. 5, 2014

(54) METHOD AND APPARATUS FOR DECREASING POWER CONSUMPTION OF POWER AMPLIFIER

(71) Applicant: Huawei Technologies Co., Ltd., Guangdong (CN)

(72) Inventors: Dongsheng Liu, Shanghai (CN); Jianhai Shen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/969,144

(22) Filed: Aug. 16, 2013

(65) Prior Publication Data

US 2013/0335142 A1    Dec. 19, 2013

Related U.S. Application Data

(63) Continuation of application No. PCT/CN2011/072772, filed on Apr. 14, 2011.

(51) Int. Cl.
H04B 1/04 (2006.01)
H03G 3/00 (2006.01)
H04W 52/04 (2009.01)

(52) U.S. Cl.
CPC ............. *H03G 3/004* (2013.01); *Y02B 60/50* (2013.01); *H04W 52/04* (2013.01)
USPC ................ 455/127.1; 455/522; 455/127.2; 455/127.5; 455/129

(58) Field of Classification Search
CPC .. H04W 52/04; H04W 52/0209; H04W 52/02
USPC .......... 455/522, 91, 127.1, 127.2, 127.5, 129, 455/574
See application file for complete search history.

(56) References Cited

U.S. PATENT DOCUMENTS

| 2001/0026600 A1 | 10/2001 | Mochizuki et al. |
| 2009/0309661 A1 | 12/2009 | Chang et al. |
| 2011/0143814 A1* | 6/2011 | Hur ............................... 455/561 |

FOREIGN PATENT DOCUMENTS

| CN | 1316843 A | 10/2001 |
| CN | 201063800 Y | 5/2008 |

(Continued)

OTHER PUBLICATIONS

International Search Report in corresponding PCT Patent Application No. PCT/CN2011/072772 (Jan. 19, 2012).

*Primary Examiner* — Tuan Pham
(74) *Attorney, Agent, or Firm* — Leydig, Voit & Mayer, Ltd.

(57) ABSTRACT

Embodiments of the present invention relate to the communication field and disclose a method and an apparatus for decreasing power consumption of a power amplifier, which minimize the power consumption of the power amplifier and extend the operation time of a mobile terminal. The method includes: obtaining a compensation power control value, where the compensation power control value is a power control value that is input to the power amplifier, and the minimum value of the input voltage is a minimum input voltage that can guarantee normal operation of the power amplifier when a preset power control value is input to the power amplifier; and inputting the minimum value of the input voltage and the compensation power control value to the power amplifier to control the power amplifier to output the preset power value of the antenna port.

6 Claims, 3 Drawing Sheets

(56) References Cited

FOREIGN PATENT DOCUMENTS

| | | |
|---|---|---|
| CN | 101316128 A | 12/2008 |
| CN | 101604960 A | 12/2009 |
| CN | 101741989 A | 6/2010 |
| CN | 101917757 A | 12/2010 |
| WO | WO 2010000184 A1 | 1/2010 |

\* cited by examiner

METHOD AND APPARATUS FOR DECREASING POWER CONSUMPTION OF POWER AMPLIFIER

CROSS-REFERENCE TO RELATED APPLICATIONS

This application is a continuation of International Application Patent No. PCT/CN2011/072772, filed on Apr. 14, 2011, which is hereby incorporated by reference in their entirety.

FIELD OF THE INVENTION

The present invention relates to the communication field, and in particular, to a method and an apparatus for decreasing power consumption of a power amplifier.

BACKGROUND OF THE INVENTION

In a mobile terminal communication system, a baseband signal is modulated into a radio frequency signal, which is transmitted by an antenna into the air after being amplified by a power amplifier. The power amplifier is a main power-consuming module of a mobile terminal, and in an operation process, the power amplifier converts, under the control of a transistor, direct current power supplied by a power source to the power amplifier into alternating current power on a load. Generally, the efficiency $\eta$ of the power amplifier means a ratio of the alternating current power Psc to the direct current power PE supplied by the power source, and is usually represented by a percentage, that is, $\eta=Psc/PE \times 100\%$.

Because the transistor itself needs to consume some power, and various circuit elements (such as resistors and transformers) also need to consume some power, the direct current power supplied by the power source to the power amplifier cannot be fully converted into the alternating current power on the load. In a wideband code division multiple access (Wideband Code Division Multiple Access, WCDMA for short) system, the efficiency $\eta$ of the power amplifier varies with a change of the alternating current power, that is, the transmit power; when the transmit power reaches the highest level of the system, the efficiency $\eta$ of the power amplifier is also the highest and may be up to 40%; and when the transmit power is small, the efficiency $\eta$ of the power amplifier is less than 10%. Because the power source of the power amplifier is generally a battery, too low efficiency not only causes an unnecessary waste of electricity energy of the battery, but also greatly shortens the life of the battery, thus reducing the operation time of the mobile terminal.

In order to decrease the power consumption generated by the power amplifier and raise the efficiency $\eta$ of the power amplifier, the prior art provides a technical solution of achieving the objective of decreasing the power consumption of the system by changing the gain mode of the power amplifier. The supply voltage of the power amplifier is one of factors affecting the gain of the power amplifier, and is also a major factor affecting the power consumption of the power amplifier. Generally, the higher the supply voltage, the higher the gain. Therefore, in the technical solution of the prior art, the operation modes of the power amplifier are classified into three levels: high gain, medium gain, and low gain. The three gain modes sequentially correspond to three different supply voltages in descending order. The level at which the supply voltage of the power amplifier is, that is, the level at which the gain mode is, is determined according to the actual gain value of the power amplifier in the operation process.

When implementing the present invention, the inventor finds that the power amplifier using the foregoing technical solution may also achieve, to a certain degree, the objective of decreasing power consumption, but this classification method is too rough, so that the effect of decreasing the power consumption of the power amplifier is not very obvious.

SUMMARY OF THE INVENTION

A technical problem to be solved by embodiments of the present invention is to provide a method and an apparatus for decreasing power consumption of a power amplifier, which can decrease the power consumption of the power amplifier and raise the operation efficiency of the power amplifier.

In order to solve the technical problem, the following technical solutions are adopted in the embodiments of the present invention:

A method for decreasing power consumption of a power amplifier includes:

obtaining a compensation power control value, where the compensation power control value is a power control value that is input to the power amplifier when an input voltage of the power amplifier is decreased to a minimum value of the input voltage under a condition of ensuring that a preset transmit power value of an antenna port is unchanged, and the minimum value of the input voltage is a minimum input voltage that can guarantee normal operation of the power amplifier when a preset power control value is input to the power amplifier; and inputting the minimum value of the input voltage and the compensation power control value to the power amplifier, to control the power amplifier to output the preset power value of the antenna port.

An apparatus for decreasing power consumption of a power amplifier includes:

an obtaining unit, configured to obtain a compensation power control value, where the compensation power control value is a power control value that is input to the power amplifier when an input voltage of the power amplifier is decreased to a minimum value of the input voltage under a condition of guaranteeing that a preset transmit power value of an antenna port is unchanged, where the minimum value of the input voltage is a minimum input voltage that can guarantee normal operation of the power amplifier when a preset power control value is input to the power amplifier; and a controlling unit, configured to input the minimum value of the input voltage and the compensation power control value to the power amplifier, to control the power amplifier to output the preset power value of the antenna port.

In the method and apparatus for decreasing power consumption of a power amplifier according to the embodiments of the present invention, under a condition that the normal operation of the power amplifier is guaranteed, the input voltage is decreased, and meanwhile, the power control value is increased appropriately, so that the power consumption of the power amplifier is decreased under a condition of not changing the transmit power. In the method of the embodiment, the input voltage of the power amplifier can be adjusted according to the current transmit power of the system, so that the power consumption of the power amplifier is minimized, the operation efficiency of the power amplifier is raised, the waste of electricity energy is reduced, and the operation time of the mobile terminal is extended.

BRIEF DESCRIPTION OF THE DRAWINGS

To make the technical solutions of the embodiments of the present invention or the prior art clearer, the accompanying drawings to be used in the description of the embodiments are briefly introduced in the following. Evidently, the accompanying drawings in the following description are only some embodiments of the present invention, and persons of ordinary skill in the art can obtain other drawings according to these drawings without creative efforts.

Embodiments of the present invention provide a method and an apparatus for decreasing power consumption of a power amplifier, which adjust an input voltage of the power amplifier according to the current transmit power of the system under a condition of not affecting the transmit power, so that the power consumption of the power amplifier is minimized, the operation efficiency of the power amplifier is raised, the waste of electricity energy is reduced, and the operation time of the mobile terminal is extended.

The embodiments of the present invention are described in detail with reference to the accompanying drawings.

EMBODIMENT 1

Figure 1:
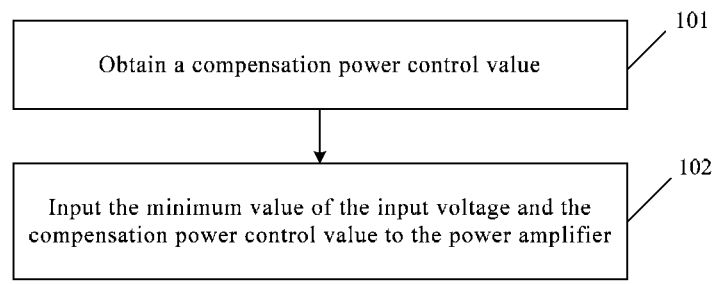
FIG. 1 is a flowchart of a method for decreasing power consumption of a power amplifier according to an embodiment of the present invention.

An embodiment of the present invention provides a method for decreasing power consumption of a power amplifier. As shown in FIG. 1, the method includes:

Step 101: Obtain a compensation power control value, where the compensation power control value is a power control value that is input to the power amplifier when an input voltage of the power amplifier is decreased to a minimum value of the input voltage under a condition of guaranteeing that a preset transmit power value of an antenna port is unchanged, and the minimum value of the input voltage is a minimum input voltage that can guarantee normal operation of the power amplifier when a preset power control value is input to the power amplifier.

In this embodiment of the present invention, the power control value is a power value of an original signal that is not amplified by the power amplifier; and the preset power value of the antenna port is the power of a signal that is to be transmitted after being amplified by the power amplifier at the antenna port.

Generally, the power amplifier operates at a rated voltage, and we name this voltage as a rated input voltage. The amplification factor of the power amplifier is determined by its own performance. Therefore, the factors affecting the preset power of the antenna port generally include the following two factors: the power control value of an input signal and the input voltage of the power amplifier. Within a certain range, the bigger the power control value and the bigger the input voltage of the power amplifier, the bigger the preset transmit power value of the antenna port.

Therefore, in order to guarantee that the preset transmit power value of the antenna port is unchanged and meanwhile decrease the input voltage of the power amplifier and reduce the power consumption of the power amplifier, the method used by the present invention is to increase the power of the input signal appropriately, that is, to use the compensation power control value to control the power amplifier to output the preset power value of the antenna port.

Step 102: Input the minimum value of the input voltage and the compensation power control value to the power amplifier to control the power amplifier to output the preset power value of the antenna port.

In an actual operation process of a mobile terminal, the preset power value of the antenna port is not fixed, but changes constantly according to requirements. That is, the minimum value of the input voltage and the compensation power control value that correspond to the preset power value of the antenna port also need to change accordingly. Therefore, in the actual operation process, the so-called "input the minimum value of the input voltage and the compensation power control value to the power amplifier to control the power amplifier to output the preset power value of the antenna port" here means, in a usual sense, "input a set of minimum values of the input voltage and a set of compensation power control values to the power amplifier, to control the power amplifier to output a set of preset power values of the antenna port".

In addition, it should also be noted that the input voltage of the power amplifier in the present invention generally means a bias voltage of the power amplifier.

In the method for decreasing power consumption of a power amplifier according to this embodiment, under a condition that the normal operation of the power amplifier is guaranteed, by using a method that the input voltage is decreased and meanwhile the power control value is increased appropriately, the power consumption of the power amplifier is decreased under a condition of not changing the transmit power. In the method of this embodiment, the input voltage of the power amplifier can be adjusted according to the current transmit power of the system, so that the power consumption of the power amplifier is minimized, the operation efficiency of the power amplifier is raised, the waste of electricity energy is reduced, and the operation time of the mobile terminal is extended.

EMBODIMENT 2

Figure 2:
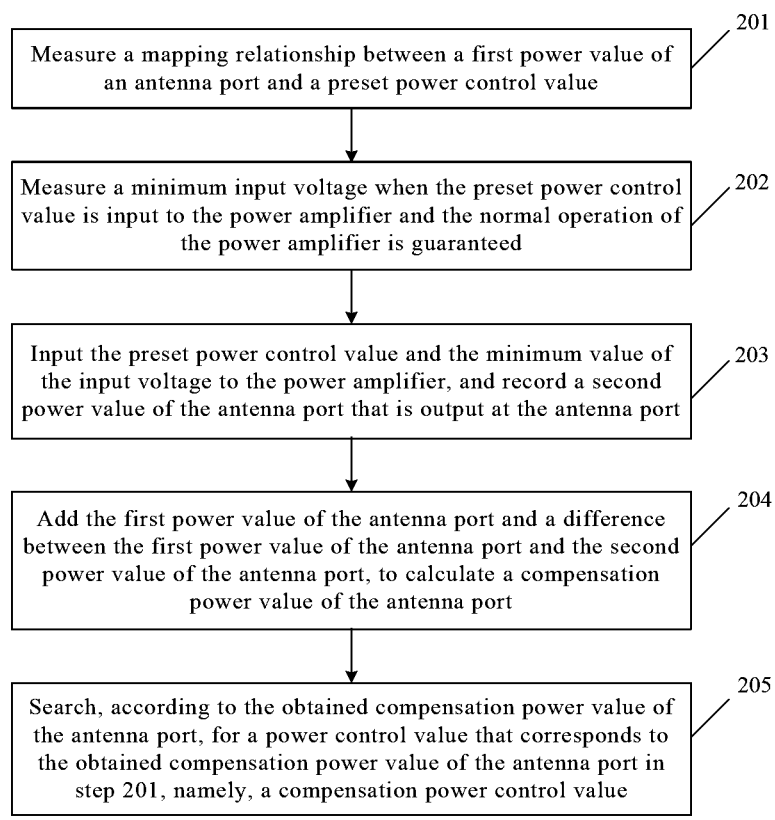
FIG. 2 is a flowchart of obtaining a compensation power control value according to an embodiment of the present invention.

An embodiment of the present invention provides a method for decreasing power consumption of a power amplifier. As shown in FIG. 2, the method includes:

Step 201: Obtain a first power value of an antenna port, where the first power value of an antenna port is output by the power amplifier when a preset power control value and a rated input voltage are input to the power amplifier.

In an actual operation process of a mobile terminal, in order to conveniently obtain the compensation power control value to control the input voltage of a power source in real time, generally the power control values required for outputting different preset power values of the antenna port are obtained firstly, and the mapping relationship between the power control values and the preset power values of the antenna port is formed into a table, so that simply by looking up the table, the desired compensation power control value may be obtained.

For example, the rated input voltage and a set of power control values are input to the power amplifier to obtain a set of power values of the antenna port, where the set of power values of the antenna port corresponds to the set of power control values and is output by the power amplifier when the rated input voltage is input to the power amplifier, and a mapping relationship between the power control value and the power value of the antenna port is established. In a WCDMA system, the output power values of the antenna port range from −55 dBm to +24 dBm, and generally, the step size of the power values of the antenna port is set to be 1 dB, that is, whenever the power value of the antenna port changes by 1 dB, a corresponding preset power control value is recorded, and thus a mapping relationship table, namely, Table 1, is obtained. The power values of the antenna port obtained in this step are named the first power values of the antenna port. The following table is a part of Table 1.

TABLE 1

| Preset Power Control Value | First Power Value of Antenna Port |
|---|---|
| xx | xx |
| 100 | 24 dBm |
| 95 | 23 dBm |
| 90 | 22 dBm |
| xx | xx |

202: Obtain the minimum value of the input voltage when the preset power control value is input to the power amplifier and the normal operation of the power amplifier is guaranteed.

The power amplifier needs to operate within a certain voltage range, and when the input voltage is too small, the power amplifier experiences a phenomenon such as "distortion" or "cut-off". Therefore, the minimum value of the input voltage here means, in a certain sense, "the minimum voltage value without distortion" for outputting a particular power value of the antenna port.

In this embodiment, a set of preset power control values are input to the power amplifier, and the corresponding minimum values of the input voltage when the normal operation of the power amplifier is guaranteed are measured. For example, under a condition that the normal operation of the power amplifier is guaranteed, the preset power control values in Table 1 in step 201 are input to the power amplifier, and then, the input voltage is decreased, and the minimum input voltages when the normal operation of the power amplifier is guaranteed, that is, the minimum values of the input voltage, are measured, and thus a mapping relationship table, namely, Table 2, is obtained. The following table is a part of Table 2.

TABLE 2

| First Power Value of Antenna Port | Minimum Value of Input Voltage |
|---|---|
| xx | xx |
| 24 dBm | V1 |
| 23 dBm | V2 |
| 22 dBm | V3 |
| xx | xx |

203: Obtain a second power value of the antenna port, where the second power value of the antenna is output by the power amplifier when the preset power control value and the minimum value of the input voltage are input to the power amplifier.

A set of preset power control values and the corresponding minimum values of the input voltage that are obtained in step 202 are input to the power amplifier, and an output set of second power values of the antenna port are recorded. For example, the preset power control values in Table 1 that are obtained in step 201 and the minimum values of the input voltage in Table 2 that are obtained in step 202 are input to the power amplifier, and the power values of the antenna port that are output at the antenna port are recorded, and thereby a mapping relationship table, namely, Table 3, is obtained. The power values of the antenna port obtained in this step are named the second power values of the antenna port. The following table is a part of Table 3.

TABLE 3

| Power Control Value | Minimum Value of Input Voltage | Second Power Value of Antenna Port |
|---|---|---|
| xx | xx | xx |
| 100 | V1 | 23.7 dBm |
| 95 | V2 | 22.6 dBm |
| 90 | V3 | 21.5 dBm |
| xx | xx | xx |

204: Add the first power value of the antenna port and a difference between the first power value of the antenna port and the second power value of the antenna port, to obtain a compensation power value of the antenna port.

For example, the difference between the first power value of the antenna port, which is in Table 1 and obtained in step 201, and the second power value of the antenna port, which is in Table 3 and obtained in step 203, is added to the first power values of the antenna port, to calculate the corresponding compensation power value of the antenna port, and thereby a mapping relationship table, namely, Table 4, is obtained. The following table is a part of Table 4.

TABLE 4

| First Power Value of Antenna Port | Minimum Value of Input Voltage | Difference between First Power Value of Antenna Port and Second Power Value of Antenna Port | Compensation Power Value of Antenna Port |
|---|---|---|---|
| xx | xx | xx | xx |
| 24 dBm | V1 | 0.3 dBm | 24.3 dBm |
| 23 dBm | V2 | 0.4 dBm | 23.4 dBm |
| 22 dBm | V3 | 0.5 dBm | 22.5 dBm |
| xx | xx | xx | xx |

205: Search, according to the compensation power value of the antenna port, the mapping relationship between the power control value and the power value of the antenna port when a rated input voltage is input to the power amplifier, so as to obtain the compensation power control value corresponding to the compensation power value of the antenna port.

In the method for obtaining the compensation power control value in this embodiment, an approximation is used, that is, when the power amplifier operates at the rated input voltage, the mapping relationship between the variation of the power of the antenna port and the variation of the power control value is approximately the same as that when the power amplifier operates at the minimum value of the input voltage.

For example, in the operation process of the mobile terminal, assuming that the required transmit power is 23 dBm, firstly the input voltage is adjusted to V2, then the corresponding compensation power value 23.4 dBm of the antenna port is searched for in Table 4 in step 204, and then, the power control value corresponding to 23.4 dBm is searched for in Table 1. We name this power control value as a compensation power control value. After that, the compensation power control value is input to the power amplifier to control the power amplifier to output the preset power value of the antenna port.

In the method of this embodiment, firstly the mapping relationship between the first power value of the antenna port and the preset power control value is measured; after that, the minimum input voltage when the preset power control value is input to the power amplifier and the normal operation of the power amplifier is guaranteed is measured; the preset power control value and the minimum value of the input voltage are input to the power amplifier, and the second power value of the antenna port that is output at the antenna port is recorded; and after that, the difference between the first power value of the antenna port and the second power value of the antenna port is added to the first power value of the antenna port, to calculate the corresponding compensation power value of the antenna port; and finally, a power control value that corresponds to the obtained compensation power value of the antenna port in step 201, namely, the compensation power control value, is searched for according to the obtained compensation power value of the antenna port. In the method of this embodiment, the input voltage is decreased, and meanwhile, the power control value is increased appropriately, so that the input voltage of the power amplifier is adjusted according to the current transmit power of the system under a condition of not affecting the transmit power, and when the required transmit power changes, the compensation power control value and the minimum input voltage that correspond to the changed transmit power can be obtained quickly by looking up tables. Thereby, the power consumption of the power amplifier is minimized, the operation efficiency of the power amplifier is raised, the waste of electricity energy is reduced, and the operation time of the mobile terminal is extended.

EMBODIMENT 3

Figure 3:
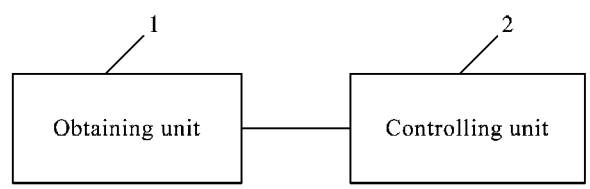
FIG. 3 is a first schematic structural diagram of an apparatus for decreasing power consumption of a power amplifier according to an embodiment of the present invention.
Figure 4:
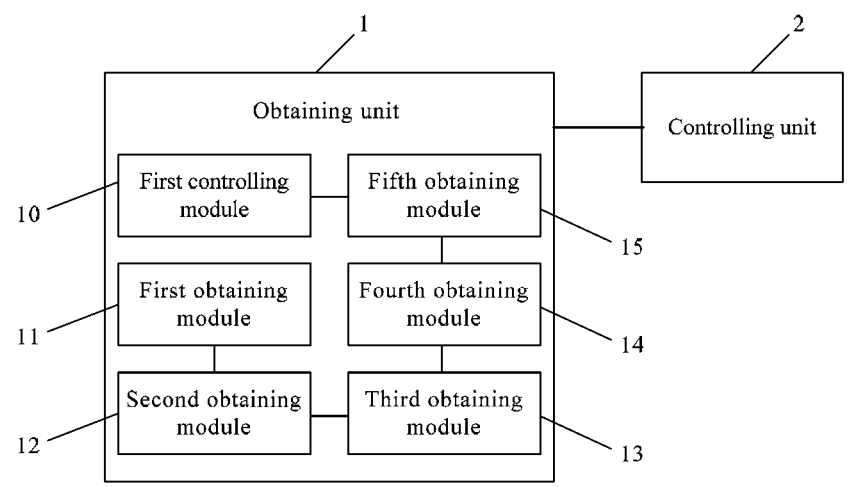
FIG. 4 is a second schematic structural diagram of an apparatus for decreasing power consumption of a power amplifier according to an embodiment of the present invention.

An embodiment of the present invention provides an apparatus for decreasing power consumption of a power amplifier. As shown in FIG. 3 and FIG. 4, the apparatus includes: an obtaining unit 1 and a controlling unit 2.

The obtaining unit 1 is configured to obtain a compensation power control value, where the compensation power control value is a power control value that is input to the power amplifier when an input voltage of the power amplifier is decreased to a minimum value of the input voltage under a condition of guaranteeing that a preset transmit power value of an antenna port is unchanged, and the minimum value of the input voltage is a minimum input voltage that can guarantee normal operation of the power amplifier when a preset power control value is input to the power amplifier.

The controlling unit 2 is configured to input the minimum value of the input voltage and the compensation power control value to the power amplifier to control the power amplifier to output the preset power value of the antenna port.

In an actual operation process of a mobile terminal, the preset power value of the antenna port is not fixed, but changes constantly according to requirements. That is, the minimum value of the input voltage and the compensation power control value that correspond to the preset power value of the antenna port also need to change accordingly. Therefore, in the actual operation process, the so-called "input the minimum value of the input voltage and the compensation power control value to the power amplifier to control the power amplifier to output the preset power value of the antenna port" here means, in a usual sense, "input a set of minimum values of the input voltage and a set of compensation power control values to the power amplifier to control the power amplifier to output a set of preset power values of the antenna port".

In the apparatus for decreasing power consumption of a power amplifier according to this embodiment, the obtaining unit includes: a first obtaining module 11, a second obtaining module 12, a third obtaining module 13, a fourth obtaining module 14, and a fifth obtaining module 15.

The first obtaining module 11 is configured to obtain a first power value of the antenna port, where the first power value of the antenna port is output by the power amplifier when a preset power control value and a rated input voltage are input to the power amplifier.

The second obtaining module 12 is configured to obtain the minimum value of the input voltage when the preset power control value is input to the power amplifier and the normal operation of the power amplifier is guaranteed.

The third obtaining module 13 is configured to obtain a second power value of the antenna port, where the second power value of the antenna port is output by the power amplifier when the preset power control value and the minimum value of the input voltage are input to the power amplifier.

The fourth obtaining module 14 is configured to add the first power value of the antenna port and a difference between the first power value of the antenna port and the second power value of the antenna port, to obtain the compensation power value of the antenna port.

The fifth obtaining module 15 is configured to search, according to the compensation power value of the antenna port, the mapping relationship between the power control value and the power value of the antenna port when the rated input voltage is input to the power amplifier, so as to obtain the compensation power control value corresponding to the compensation power value of the antenna port.

In an actual operation process of a mobile terminal, in order to conveniently obtain the compensation power control value to control the input voltage of a power source in real time, generally the power control values required for outputting different preset power values of the antenna port are obtained firstly, and the mapping relationship between the power control value and the preset power value of the antenna port is formed into a table, so that simply by looking up the table, the desired compensation power control value may be obtained.

In this embodiment, the obtaining unit 1 also includes: a first controlling module 10, configured to input the rated input voltage and a set of power control values to the power amplifier to obtain a set of power values of the antenna port, where the set of power values of the antenna port corresponds to the set of power control values and is output by the power amplifier when the rated input voltage is input to the power amplifier; and establish a mapping relationship between the power control value and the power value of the antenna port.

The power amplifier needs to operate within a certain voltage range, and when the input voltage is too small, the power amplifier experiences a phenomenon such as "distortion" or "cut-off". Therefore, the minimum value of the input voltage here means, in a certain sense, "the minimum voltage value without distortion" for outputting a particular power value of the antenna port.

In this embodiment, the input voltage of the power amplifier is a bias voltage of the power amplifier.

In the apparatus for decreasing power consumption of a power amplifier according to this embodiment, under a condition that the normal operation of the power amplifier is guaranteed, by using a method that the input voltage is decreased and the power control value is increased appropriately, the power consumption of the power amplifier is decreased under a condition of not changing the transmit power. The apparatus of the embodiment can adjust the input voltage of the power amplifier according to the current transmit power of the system, thereby minimizing the power consumption of the power amplifier, raising the operation efficiency of the power amplifier, reducing the waste of electricity energy, and extending the operation time of the mobile terminal.

Through the description of the foregoing embodiments, persons skilled in the art may clearly understand that the present invention may be implemented by software and a necessary general hardware, and definitely may also by implemented by hardware only, but the former is preferred in many cases. Based on such understanding, the essence of the technical solutions of the present invention, or the part contributing to the prior art may be embodied in the form of a software product. The computer software product is stored in a readable storage medium, such as a computer floppy disk, a hard disk, or a CD-ROM, and includes several instructions to cause a computer device (which may be a personal computer, a server, or a network device) to execute the method described in each embodiment of the present invention.

Detailed above are only exemplary embodiments of the present invention, but the protection scope of the present invention is not limited thereto. Any modification or substitution readily conceivable by persons skilled in the art within the technical scope of the technology disclosed in the present invention shall be covered within the protection scope of the present invention. Therefore, the protection scope of the present invention shall be subject to the protection scope of the appended claims.

What is claimed is:

1. A method for decreasing power consumption of a power amplifier, comprising:
    obtaining a compensation power control value, wherein the compensation power control value is a power control value that is input to the power amplifier when an input voltage of the power amplifier is decreased to a minimum value of the input voltage under a condition of guaranteeing that a preset transmit power value of an antenna port is unchanged, and the minimum value of the input voltage is a minimum input voltage that can guarantee normal operation of the power amplifier when a preset power control value is input to the power amplifier; and
    inputting the minimum value of the input voltage and the compensation power control value to the power amplifier to control the power amplifier to output the preset power value of the antenna port,
    wherein the obtaining the compensation power control value comprises:
        obtaining a first power value of the antenna port, wherein the first power value of the antenna port is output by the power amplifier when the preset power control value and a rated input voltage are input to the power amplifier;
        obtaining the minimum value of the input voltage when the preset power control value is input to the power amplifier and the normal operation of the power amplifier is guaranteed;
        obtaining a second power value of the antenna port, wherein the second power value of the antenna port is output by the power amplifier when the preset power control value and the minimum value of the input voltage are input to the power amplifier;
        adding the first power value of the antenna port and a difference between the first power value of the antenna port and the second power value of the antenna port, to obtain compensation power value of the antenna port; and
        searching, according to the compensation power value of the antenna port, a mapping relationship between the power control value and the power value of the antenna port when the rated input voltage is input to the power amplifier, so as to obtain the compensation power control value corresponding to the compensation power value of the antenna port.

2. The method according to claim 1, further comprising:
    inputting the rated input voltage and a set of power control values to the power amplifier to obtain a set of power values of the antenna port, wherein the set of power values of the antenna port corresponds to the set of power control values and is output by the power amplifier when the rated input voltage is input to the power amplifier, and establishing the mapping relationship between the power control value and the power value of the antenna port.

3. The method according to claim 2, wherein the input voltage of the power amplifier is a bias voltage of the power amplifier.

4. An apparatus for decreasing power consumption of a power amplifier, comprising:
    an obtaining unit, configured to obtain a compensation power control value, wherein the compensation power control value is a power control value that is input to the power amplifier when an input voltage of the power amplifier is decreased to a minimum value of the input voltage under a condition of guaranteeing that a preset transmit power value of an antenna port is unchanged, and the minimum value of the input voltage is a minimum input voltage that can guarantee normal operation of the power amplifier when a preset power control value is input to the power amplifier; and
    a controlling unit, configured to input the minimum value of the input voltage and the compensation power control value to the power amplifier to control the power amplifier to output the preset power value of the antenna port;
    wherein the obtaining unit comprises:
        a first obtaining module, configured to obtain a first power value of the antenna port, wherein the first power value of the antenna port is output by the power amplifier when the preset power control value and a rated input voltage are input to the power amplifier;
        a second obtaining module, configured to obtain the minimum value of the input voltage when the preset power control value is input to the power amplifier and the normal operation of the power amplifier is guaranteed;
        a third obtaining module, configured to obtain a second power value of the antenna port, wherein the second power value of the antenna port is output by the power amplifier when the preset power control value and the minimum value of the input voltage are input to the power amplifier;
        a fourth obtaining module, configured to add the first power value of the antenna port and a difference between the first power value of the antenna port and the second power value of the antenna port, to obtain a compensation power value of the antenna port; and
        a fifth obtaining module, configured to search, according to the compensation power value of the antenna port, a mapping relationship between the power control value and the power value of the antenna port when the rated input voltage is input to the power amplifier, so as to obtain the compensation power control value corresponding to the compensation power value of the antenna port.

5. The apparatus according to claim 4, wherein the obtaining unit further comprises:
    a first controlling module, configured to: input the rated input voltage and a set of power control values to the power amplifier to obtain a set of power values of the antenna port, wherein the set of power values of the antenna port corresponds to the set of power control values and is output by the power amplifier when the rated input voltage is input to the power amplifier; and establish the mapping relationship between the power control values and the power values of the antenna port.

6. The apparatus according to claim 5, wherein the input voltage of the power amplifier is a bias voltage of the power amplifier.

\* \* \* \* \*